(12) United States Patent  (10) Patent No.: US 7,936,074 B2
Teig  (45) Date of Patent: *May 3, 2011

(54) PROGRAMMABLE SYSTEM IN PACKAGE

(75) Inventor: Steven Teig, Menlo Park, CA (US)

(73) Assignee: Tabula, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/861,204

(22) Filed: Sep. 25, 2007

(65) Prior Publication Data

US 2008/0068042 A1 Mar. 20, 2008

Related U.S. Application Data

(63) Continuation of application No. 11/081,842, filed on Mar. 15, 2005, now Pat. No. 7,301,242.

(60) Provisional application No. 60/625,263, filed on Nov. 4, 2004.

(51) Int. Cl.
*H01L 23/48* (2006.01)

(52) U.S. Cl. ............. 257/777; 257/686; 257/E25.006; 257/E25.013; 257/E25.021; 257/E25.027; 257/E23.085

(58) Field of Classification Search .............. 257/723, 257/777, 686, E25.005, E25.006, E25.021, 257/E25.027, E23.085, 685, E25.01, E25.012, 257/E25.015, E25.016, E25.02, E25.025, 257/E25.031, E25.032, E23.042

See application file for complete search history.

(56) References Cited

U.S. PATENT DOCUMENTS

| | | | |
|---|---|---|---|
| 5,426,378 A | 6/1995 | Ong | |
| 5,434,453 A | 7/1995 | Yamamoto et al. | |
| 5,512,765 A | 4/1996 | Gaverick | |
| 5,521,835 A | 5/1996 | Trimberger | |
| 5,530,292 A * | 6/1996 | Waki et al. | 257/724 |
| 5,596,743 A | 1/1997 | Bhat et al. | |
| 5,600,263 A | 2/1997 | Trimberger et al. | |
| 5,610,442 A * | 3/1997 | Schneider et al. | 257/787 |
| 5,610,829 A | 3/1997 | Trimberger | |
| 5,629,637 A | 5/1997 | Trimberger et al. | |
| 5,646,545 A | 7/1997 | Trimberger et al. | |

(Continued)

FOREIGN PATENT DOCUMENTS

JP 4-162767 * 6/1992 ............. 257/777

(Continued)

OTHER PUBLICATIONS

U.S. Appl. No. 11/269,506, filed Nov. 7, 2005, Schmit, Herman, et al.

(Continued)

*Primary Examiner* — Jasmine J Clark
(74) *Attorney, Agent, or Firm* — Adeli & Tollen LLP

(57) ABSTRACT

Some embodiments of the invention provide a programmable system in package ("PSiP"). The PSiP includes a single IC housing, a substrate and several IC's that are arranged within the single IC housing. At least one of the IC's is a configurable IC. In some embodiments, the configurable IC is a reconfigurable IC that can reconfigure more than once during run time. In some of these embodiments, the reconfigurable IC can be reconfigured at a first clock rate that is faster (i.e., larger) than the clock rates of one or more of the other IC's in the PSiP. The first clock rate is faster than the clock rate of all of the other IC's in the PSiP in some embodiments.

22 Claims, 10 Drawing Sheets

U.S. PATENT DOCUMENTS

| | | | |
|---|---|---|---|
| 5,701,441 | A | 12/1997 | Trimberger |
| 5,721,498 | A | 2/1998 | Mason et al. |
| 5,761,483 | A | 6/1998 | Trimberger |
| 5,815,372 | A | 9/1998 | Gallas |
| 5,825,662 | A | 10/1998 | Trimberger |
| 5,869,896 | A | 2/1999 | Baker et al. |
| 5,920,712 | A | 7/1999 | Kuijsten |
| 5,944,813 | A | 8/1999 | Trimberger |
| 5,952,725 | A * | 9/1999 | Ball .............................. 257/777 |
| 5,973,340 | A | 10/1999 | Mohsen |
| 6,015,722 | A | 1/2000 | Banks et al. |
| 6,084,429 | A | 7/2000 | Trimberger |
| 6,100,594 | A | 8/2000 | Fukui et al. |
| 6,137,164 | A | 10/2000 | Yew et al. |
| 6,480,954 | B2 | 11/2002 | Trimberger et al. |
| 6,515,505 | B1 | 2/2003 | Rees |
| 6,601,227 | B1 | 7/2003 | Trimberger |
| 6,633,182 | B2 | 10/2003 | Pileggi et al. |
| 6,650,142 | B1 | 11/2003 | Agrawal et al. |
| 6,686,223 | B2 | 2/2004 | Uchida |
| 6,709,890 | B2 * | 3/2004 | Ida et al. ........................ 438/109 |
| 6,737,755 | B1 | 5/2004 | McLellan et al. |
| 6,744,126 | B1 | 6/2004 | Chiang |
| 6,781,226 | B2 * | 8/2004 | Huppenthal et al. .......... 257/686 |
| 6,829,756 | B1 | 12/2004 | Trimberger |
| 6,906,407 | B2 | 6/2005 | Byers et al. |
| 6,922,665 | B1 | 7/2005 | Guccione et al. |
| 6,964,029 | B2 | 11/2005 | Poznanovic et al. |
| 6,969,898 | B1 * | 11/2005 | Exposito et al. ............... 257/434 |
| 6,989,285 | B2 * | 1/2006 | Ball ................. 438/33 |
| 6,991,947 | B1 | 1/2006 | Gheewala |
| 7,009,303 | B2 | 3/2006 | Kuroda et al. |
| 7,030,651 | B2 | 4/2006 | Madurawe |
| 7,062,744 | B2 | 6/2006 | Osann, Jr. |
| 7,082,591 | B2 | 7/2006 | Carlson |
| 7,091,598 | B2 | 8/2006 | Fujita et al. |
| 7,109,752 | B1 | 9/2006 | Schmit et al. |
| 7,126,214 | B2 | 10/2006 | Huppenthal et al. |
| 7,138,827 | B1 | 11/2006 | Trimberger |
| 7,143,329 | B1 | 11/2006 | Trimberger et al. |
| 7,200,235 | B1 | 4/2007 | Trimberger |
| 7,203,842 | B2 | 4/2007 | Kean |
| 7,212,448 | B1 | 5/2007 | Trimberger |
| 7,219,421 | B2 * | 5/2007 | Vrtis et al. ..................... 29/827 |
| 7,224,182 | B1 | 5/2007 | Hutchings et al. |
| 7,259,587 | B1 | 8/2007 | Schmit et al. |
| 7,286,976 | B2 | 10/2007 | Diehl et al. |
| 7,301,242 | B2 * | 11/2007 | Teig .............................. 257/777 |
| 7,310,757 | B2 | 12/2007 | Ngo et al. |
| 7,328,384 | B1 | 2/2008 | Kulkarni et al. |
| 7,424,655 | B1 | 9/2008 | Trimberger |
| 7,530,044 | B2 | 5/2009 | Teig |
| 7,532,032 | B2 | 5/2009 | Schmit et al. |
| 2002/0010853 | A1 | 1/2002 | Trimberger et al. |
| 2002/0066956 | A1 | 6/2002 | Taguchi |
| 2002/0157071 | A1 | 10/2002 | Schiefele et al. |
| 2004/0040005 | A1 | 2/2004 | Carison |
| 2004/0061147 | A1 | 4/2004 | Fujita et al. |
| 2004/0088666 | A1 | 5/2004 | Poznanovic et al. |
| 2004/0105207 | A1 | 6/2004 | Spaderna et al. |
| 2004/0130036 | A1 | 7/2004 | Owaki et al. |
| 2004/0169285 | A1 | 9/2004 | Verma et al. |
| 2004/0221451 | A1 | 11/2004 | Chia et al. |
| 2004/0243383 | A1 | 12/2004 | Garino et al. |
| 2004/0262774 | A1 | 12/2004 | Kang et al. |
| 2005/0017336 | A1 | 1/2005 | Kung et al. |
| 2005/0051903 | A1 | 3/2005 | Ellsberry et al. |
| 2005/0066294 | A1 | 3/2005 | Templeton et al. |
| 2005/0181539 | A1 | 8/2005 | Ohie |
| 2005/0189634 | A1 | 9/2005 | Wakiyama et al. |
| 2005/0193353 | A1 | 9/2005 | Malekkhosravi et al. |
| 2005/0257178 | A1 | 11/2005 | Daems et al. |
| 2005/0269687 | A1 | 12/2005 | Forcier |
| 2005/0275074 | A1 | 12/2005 | Weng et al. |
| 2006/0071701 | A1 | 4/2006 | Nickolls |
| 2006/0118927 | A1 | 6/2006 | Verma et al. |
| 2006/0195729 | A1 | 8/2006 | Huppenthal et al. |
| 2007/0045806 | A1 | 3/2007 | Hsuan |
| 2007/0075737 | A1 | 4/2007 | Schmit et al. |
| 2007/0108598 | A1 | 5/2007 | Zhong et al. |
| 2007/0143577 | A1 | 6/2007 | Smith |
| 2007/0241461 | A1 | 10/2007 | Teig |
| 2007/0245270 | A1 | 10/2007 | Teig |
| 2008/0179729 | A1 | 7/2008 | Shim et al. |
| 2008/0215854 | A1 | 9/2008 | Asaad et al. |
| 2008/0220563 | A1 | 9/2008 | Karnezos |
| 2008/0293167 | A1 | 11/2008 | Wada et al. |

FOREIGN PATENT DOCUMENTS

| | | | |
|---|---|---|---|
| JP | 5-343606 | * 12/1993 | ................. 257/777 |
| KR | 2002-696100 | * 5/2000 | |

OTHER PUBLICATIONS

U.S. Appl. No. 11/269,868, filed Nov. 7, 2005, Horel, Timothy.
U.S. Appl. No. 11/271,165, filed Nov. 11, 2005, Horel, Timothy, et al.
Non-Final Office Action for U.S. Appl. No. 11/081,820, Mar. 17, 2008 (mailing date), Teig, Steven.
Non-Final Office Action for U.S. Appl. No. 11/081,820, Jun. 4, 2007 (mailing date), Teig, Steven.
Non-Final Office Action for U.S. Appl. No. 11/081,820, Oct. 6, 2006 (mailing date), Teig, Steven, now U.S. Published Application 2007/0245270.
Non-Final Office Action for U.S. Appl. No. 11/081,842, Feb. 2, 2007 (mailing date), Teig, Steven, now U.S. Patent 7,301,242.
Non-Final Office Action for U.S. Appl. No. 11/081,842, Jul. 12, 2006 (mailing date), Teig, Steven, now U.S. Patent 7,301,242.
Non-Final Office Action for U.S. Appl. No. 11/271,165, Oct. 15, 2007 (mailing date), Horel, Timothy, et al.
Non-Final Office Action for U.S. Appl. No. 11/269,868, Jul. 16, 2008 (mailing date), Horel, Timothy.
Non-Final Office Action for U.S. Appl. No. 11/269,868, Nov. 20, 2007 (mailing date), Horel, Timothy.
Non-Final Office Action for U.S. Appl. No. 11/269,506, Jun. 23, 2008 (mailing date), Schmit, Herman, et al.
Non-Final Office Action for U.S. Appl. No. 11/269,506, Sep. 5, 2007 (mailing date), Schmit, Herman, et al.
Supplemental Notice of Allowability for U.S. Appl. No. 11/081,842, Jul. 27, 2007 (mailing date), Teig, Steven, now U.S. Patent 7,301,242.
Notice of Allowance for U.S. Appl. No. 11/081,842, Jun. 15, 2007 (mailing date), Teig, Steven, now U.S. Patent 7,301,242.
Patel, C., et al., "An Architectural Exploration of Via Patterned Gate Arrays," *Proceedings of the 2003 international symposium on physical design*, Apr. 6-9, 2003, pp. 184-189, Monterey, CA, USA.
Patel, C., et al., "An Architectural Exploration of Via Patterned Gate Arrays," *Carnegie Mellon University Center for Silicon System Implementation*, NPL Date Unknown, Slides 1-23.
Taylor, R., et al., "Enabling Energy Efficiency in Via-Patterned Gate Array Devices", *Proceedings of the 41st annual conference on Design automation*, Jun. 7-11, 2004, San Diego, California, USA.
Tong, K.T., et al., "Regular Logic Fabrics for a Via Patterned Gate Array (VPGA)," *Proceedings of the IEEE 2003 Custom Integrated Circuits Conference 2003*, Sep. 21-24, 2003.
Trimberger, S., "Effects of FPGA Architecture on FPGA Routing," *32nd ACM/IEEE Design Automation Conference*, Jun. 1995, ACM.
U.S. Appl. No. 12/198,878, filed Aug. 26, 2008, Teig, Steven.
Restriction Requirement of U.S. Appl. No. 11/081,820, Jul. 27, 2006 (mailing date), Teig, Steven.
Restriction Requirement of U.S. Appl. No. 11/271,165, May 18, 2007 (mailing date), Horel, Timothy, et al.
Notice of Allowance of U.S. Appl. No. 11/081,820, Dec. 1, 2008 (mailing date), Teig, Steven.
Final Office Action of U.S. Appl. No. 11/271,165, Jan. 29, 2009 (mailing date), Horel, Timothy, et al.
Non-Final Office Action of U.S. Appl. No. 11/269,868, Feb. 6, 2009 (mailing date), Horel, Timothy.
Non-Final Office Action of U.S. Appl. No. 11/269,506, Feb. 6, 2009 (mailing date), Schmit, Herman, et al.
Non-Final Office Action of U.S. Appl. No. 11/271,165, Jun. 26, 2009 (mailing date), Horel, Timothy, et al.
Non-Final Office Action of U.S. Appl. No. 11/269,868, Aug. 5, 2009 (mailing date), Horel, Timothy.

Non-Final Office Action of U.S. Appl. No. 11/269,506, Sep. 29, 2009 (mailing date), Schmit, Herman, et al.

Updated portions of prosecution history of U.S. Appl. No. 11/081,820, filed Sep. 18, 2008, Teig, Steven.

Updated portions of prosecution history of U.S. Appl. No. 11/081,842, filed Sep. 17, 2007, Teig, Steven.

Updated portions of prosecution history of U.S. Appl. No. 11/271,165, filed Feb. 1, 2010, Horel, Timothy, et al.

Updated portions of prosecution history of U.S. Appl. No. 11/269,868, filed Jan. 13, 2010, Horel, Tim.

Updated portions of prosecution history of U.S. Appl. No. 11/269,506, filed Jan. 29, 2010, Schmit, Herman, et al.

Updated portions of prosecution history of U.S. Appl. No. 12/198,878, filed Feb. 19, 2010, Teig, Steven.

Updated Portions of Prosecution History of U.S. Appl. No. 11/081,820, filed Dec. 1, 2008, Teig, Steven.

Updated Portions of Prosecution History of U.S. Appl. No. 11/081,842, filed Sep. 26, 2007, Teig, Steven.

Updated Portions of Prosecution History of U.S. Appl. No. 11/271,165, filed Aug. 30, 2010, Horel, Timothy, et al.

Updated Portions of Prosecution History of U.S. Appl. No. 11/269,868, filed Jul. 29, 2010, Horel, Timothy.

Updated Portions of Prosecution History of U.S. Appl. No. 11/269,506, filed May 11, 2010, Schmitt, Herman, et al.

Updated Portions of Prosecution History of U.S. Appl. No. 12/198,878, filed Sep. 24, 2010, Teig, Steven.

* cited by examiner

TOP VIEW

SIDE VIEW

PROGRAMMABLE SYSTEM IN PACKAGE

CLAIM OF BENEFIT TO PRIOR APPLICATIONS

This Application is a continuation application of U.S. patent application Ser. No. 11/081,842, filed Mar. 15, 2005, now issued as U.S. Pat. No. 7,301,242, entitled "Programmable System in Package". U.S. patent application Ser. No. 11/081,842 claims benefit to U.S. Provisional Patent Application 60/625,263, filed Nov. 4, 2004, entitled "Method and Apparatus for a Programmable System in Package". U.S. Provisional Patent Application 60/625,263 and U.S. Pat. No. 7,301,242 are incorporated herein by reference.

CROSS REFERENCE TO RELATED APPLICATION

This Application is related to U.S. patent application Ser. No. 11/081,820, filed Mar. 15, 2005, now issued as U.S. Pat. No. 7,530,044.

FIELD OF THE INVENTION

The present invention is directed towards programmable system in package.

BACKGROUND OF THE INVENTION

The use of configurable integrated circuits ("IC's") has dramatically increased in recent years. One example of a configurable IC is a field programmable gate array ("FPGA"). An FPGA is a field programmable IC that has an internal array of logic circuits (also called logic blocks) that are connected together through numerous interconnect circuits (also called interconnects) and that are surrounded by input/output blocks. Like some other configurable IC's, the logic circuits and the interconnect circuits of an FPGA are configurable (i.e., they can be configured to perform different functions and operations by receiving different configuration data). One benefit of configurable IC's is that they can be uniformly mass produced and then subsequently configured to perform different operations.

Recently, some have suggested implementing an FPGA within a system on chip ("SoC"). A SoC is an IC that includes all of the necessary hardware and electronic circuitry for a complete system. The SoC is typically a small piece of semiconducting material (e.g., silicon) on which several macroblocks are embedded. Some of these macroblocks can include a memory, a microprocessor, digital signal processor, etc. A characteristic of the SoC is that it requires all the macroblocks to be manufactured with one type of fabrication technology. This can be problematic since each macroblock may have a different optimal fabrication technology (e.g., a memory macroblock might be optimally manufactured at 90 nm, while an analog macroblock might be optimally manufactured at 180 nm). As such, in some instances, some of the macroblocks of a SoC might be manufactured sub-optimally. Another drawback of a SoC is that the design process is often extensive, cumbersome and expensive.

Therefore, there is a need in the art for a better method of fabricating a configurable IC that has configurable IC operations and non-configurable IC operations within the IC.

SUMMARY OF THE INVENTION

Some embodiments of the invention provide a programmable system in package ("PSiP"). The PSiP includes a single IC housing, a substrate and several IC's that are arranged within the single IC housing. At least one of the IC's is a configurable IC. In some embodiments, the configurable IC is a reconfigurable IC that can reconfigure more than once during run time. In some of these embodiments, the reconfigurable IC can be reconfigured at a first clock rate that is faster (i.e., larger) than the clock rates of one or more of the other IC's in the PSiP. The first clock rate is faster than the clock rate of all of the other IC's in the PSiP in some embodiments.

Some embodiments provide a method for manufacturing a programmable system in package. The method divides a system into sets of operations. For each set of operations, the method identifies an integrated circuit ("IC") for performing the set of operations. The method packages a set of identified IC's into a single IC package. The set of identified IC's includes at least one configurable IC. In some embodiments, the configurable IC is a reconfigurable IC that can reconfigure more than once during run time.

Other embodiments of the invention provide a method for selecting a set of IC's for a PSiP. The method defines a budget for implementing the PSiP. The method identifies sets of operations that the PSiP has to implement. For each particular set of operations, the method identifies an IC to implement the particular set of operations. When the method identifies a set of IC's for implementing the PSiP's sets of operations, the method determines whether the cost of the identified set of IC's is less than the budget. If so, the method selects the identified set of IC's. Otherwise, the method searches for another set of IC's to implement the PSiP's operations. In the set of IC's that the method eventually selects, there is at least one IC that is a configurable IC. In some embodiments, the configurable IC is a reconfigurable IC that can reconfigure more than once during run time.

In some of the embodiments described above, the set of IC's may include digital and analog IC's. Furthermore, in some embodiments, the set of IC's may include IC's that are manufactured with different fabrication technologies. Moreover, different embodiments might package the set of IC's differently in a single package. Some embodiments might stack the set of IC's on top of each other into a single package. Some embodiments might place the set of IC's side by side into a single package. Some embodiments might stack some IC's while placing other IC's side by side in a single package.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for purpose of explanation. However, one of ordinary skill in the art will realize that the invention may be practiced without the use of these specific details. In other instances well-known structures and devices are shown in block diagram form in order not to obscure the description of the invention with unnecessary detail.

Some embodiments of the invention provide a programmable system in package ("PSiP"). The PSiP includes a single IC housing, a substrate and several IC's that are arranged within the single IC housing. At least one of the IC's is a configurable IC. In some embodiments, the configurable IC is a reconfigurable IC that can reconfigure more than once during "run time".

As used in this document, run time means a period during which the PSiP continuously receives power (i.e., after the PSiP starts receiving power and before the PSiP stops receiving power). Also, in this document, the term "IC" refers to a semiconductor wafer on which a number of circuit elements (e.g., transistors, resistors, etc.) have been defined.

In some of these embodiments, the reconfigurable IC can be reconfigured at a first clock rate that is faster (i.e., larger) than the clock rates of one or more of the other IC's in the PSiP. The first clock rate is faster than the clock rate of all of the other IC's in the PSiP in some embodiments.

In some of the embodiments, the set of IC's may include digital and analog IC's. Furthermore, in some embodiments, the set of IC's may include IC's that are manufactured with different fabrication technologies. Moreover, different embodiments might package the set of IC's differently in a single package. Some embodiments might stack the set of IC's on top of each other into a single package. Some embodiments might place the set of IC's side by side into a single package. Some embodiments might stack some IC's while placing other IC's side by side in a single package.

I. Structure of PSiP with Configurable IC

A. Stacked IC's

Figure 1:
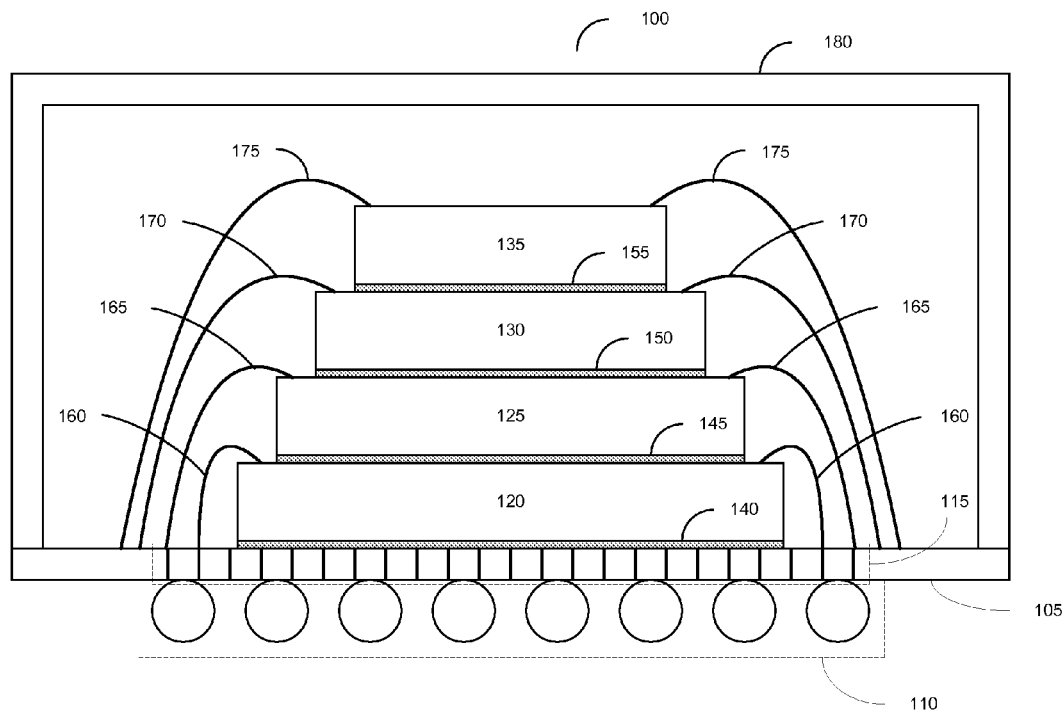
FIG. 1 illustrates a PSiP with IC's that are stacked in a pyramid structure and includes a ball grid array.

FIG. 1 illustrates an example of a PSiP that includes several IC's that are stacked. As shown in this figure, the PSiP 100 includes a substrate 105, a ball grid array ("BGA") 110, a set of vias 115, a first IC 120, a second IC 125, a third IC 130, a fourth IC 135, a first adhesive 140, a second adhesive 145, a third adhesive 150, a fourth adhesive 155, a first set of wire-bonding 160, a second set of wire-bonding 165, a third set of wire-bonding 170, a fourth set of wire-bonding 175, and a housing 180. In some embodiments, at least one of the IC's 120-135 is a configurable IC, or a reconfigurable IC, as further described below.

As shown in FIG. 1, the substrate 105 serves as a base for creating the PSiP. In some embodiments, the substrate 105 is a non-conducting or insulating material that prevents outside electrical phenomena (e.g., current, voltage) from interfering with the internal IC's (e.g., first, second, third, fourth IC's) of the PSiP 100.

Figure 2:
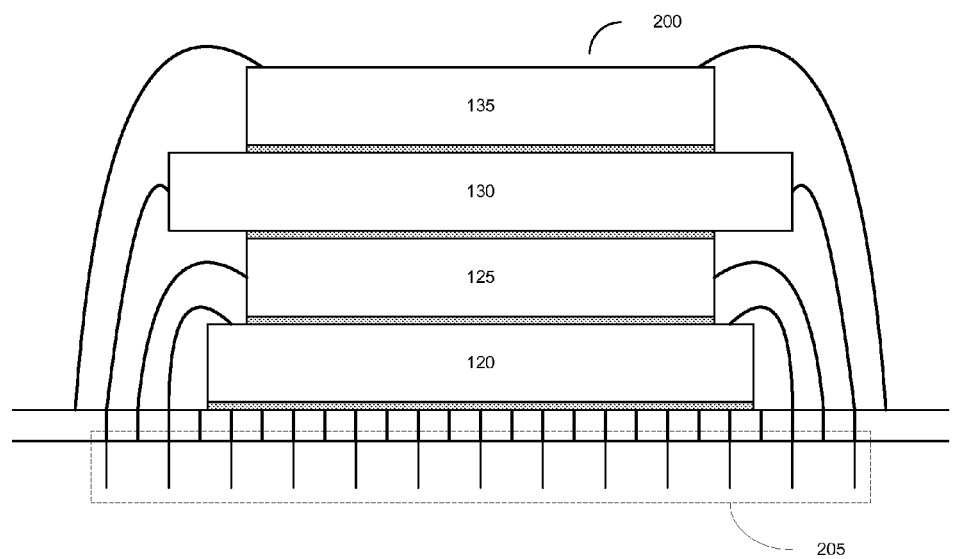
FIG. 2 illustrates a PSiP with IC's that are stacked in a non-pyramid structure and includes a pin grid array.

As further shown in FIG. 1, the first IC 120 is located on top of the substrate 105. A first adhesive 140 bonds the first IC 120 to the substrate 105. The second IC 125 is located on top of the first IC 120. The second adhesive 145 bonds the second IC 125 to the first IC 120. The third IC 130 is located on top of the second IC 125. The third adhesive 150 bonds the second IC 125 to the third IC 130. The fourth IC 135 is located on top of the third IC 130. The fourth adhesive 155 bonds the third IC 130 to the fourth IC 135. As shown in this figure, the ICs 120-135 are stacked in a pyramid structure. That is, the ICs 120-135 are stacked bottom to top, from the largest IC to the smallest IC. However, other embodiments might stack the ICs 120-135 differently, such as shown in FIG. 2.

As further shown in FIG. 1, the first IC 120 is communicatively attached to the substrate 105 through the first set of wire-bonding 160. Similarly, each of the IC's 125-135 is communicatively attached to the substrate 105 through a respective set of wire-bonding 165, 170, or 175. These sets of wire-bonding 160-175 allow the first, second, third and fourth IC's 120-135 to communicate with each other without having to go outside of the PSiP 100. In some embodiments, the IC's 120-135 might be directly wire-bonded to each other in order to facilitate communication between these IC's. Instead of, or in conjunction with the sets of wire-bonding 160-175, some embodiments might use other mechanisms to communicatively couple the IC's 120-135 to each other. Furthermore, FIG. 1 illustrates the sets of wire-bonding 160-175 attached to the top surface of the IC's 120-135. However, in other embodiments, the sets of wire-bonding 160-175 may be attached to another surface area (e.g. side surface area) of the IC's 120-135 of the PSiP 100, such as shown in FIG. 2.

As further shown in FIG. 1, the substrate 105 includes the BGA 110 and the set of vias 115. The BGA 110 is a set of solder balls that allows the PSiP 100 to be attached to a printed circuit board ("PCB"). Each via connects a solder ball in the BGA 110 on the bottom of the substrate 105, to a conductor on the top of the substrate 105.

The conductors on the top of the substrate 105 are electrically coupled to the IC's 120-135 through the sets of wire bonding 160-175. Accordingly, the IC's 120-135 can send and receive signals to and from circuits outside of the PSiP 100 through the sets of wire bonding 160-175, the conductors on the top of the substrate 105, the set of vias 115, and the BGA 110.

Some embodiments place the BGA 110 in a concentric two-dimensional array at the bottom of the substrate. Other embodiments might place the BGA 110 in other arrangements (e.g., in a peripheral arrangement around the perimeter of the PSiP 100). In other embodiments, a PSiP 200 includes a pin grid array ("PGA") 205, as shown in FIG. 2. The PGA 205 performs the same function as the BGA 115 shown in FIG. 1. As such, in combination with the set of vias 115, the PGA 205 provides an intermediate that allows the IC's 120-135 inside the PSiP 200 to communicate with other IC's outside the PSiP 200.

As further shown in FIG. 1, the housing 180 encapsulates the substrate 105, the BGA 110, the set of vias 115, the IC's 120-135, the adhesives 140-155, the sets of wire-bonding 160-175 to form the PSiP 100.

In the figures mentioned above and below, the PSiPs are shown attached to a PCB facing up. However, one of ordinary skill in the art will realize that other PSiP structures can be used. For example, some embodiments might use a flip chip structure. In such instances, the PSiPs are flipped over and attached to the PCB facing down.

B. Side by Side IC's

Figure 3:
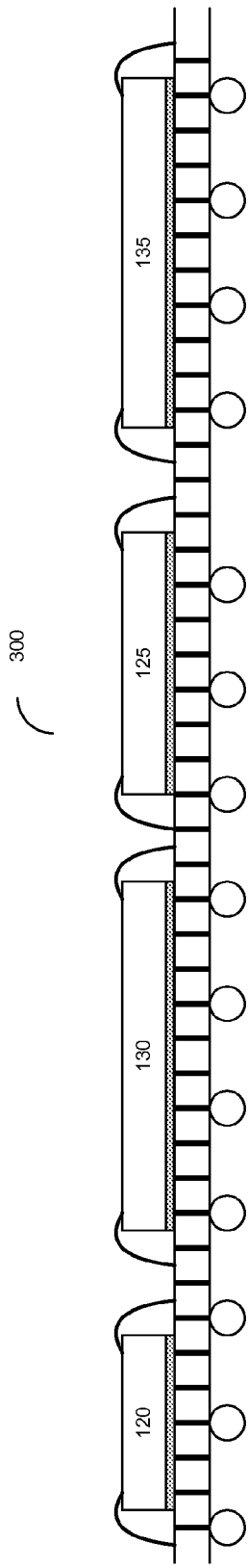
FIG. 3 illustrates a PSiP with IC's that are placed side by side.

FIG. 3 illustrates an example of a PSiP 300 that includes several IC's that are placed side by side to each other. As shown in this figure, the first, second, third and fourth IC's 120-135 are located on top of the substrate 105. In some embodiments, at least one of the IC's 120-135 is a configurable IC or a reconfigurable IC, as further described below.

In the PSiP 300, each IC is placed side by side to each other. A first adhesive 140 is placed between the first IC 120 and the substrate 105 to bond them together. Similarly, a second, third and fourth adhesive 145-155 are respectively placed between the second, third and fourth IC 125-135 and the substrate 105. A first, second, third and fourth set of wire-bonding 160-175 are attached respectively to the first, second, third and fourth IC's 120-135. These sets of wire-bonding 160-175 allow the IC's 120-135 (1) to communicate with each other without having to go outside of the PSiP, and (2) to communicate with IC's that are located outside of the PSiP 300.

The PSiP 300 includes a BGA 110 and a set of vias 115. As previously mentioned, the BGA 110 and the set of vias 115 allow the IC's 120-135 to communicate with IC's outside of the PSiP 300. In contrast to the PSiP 100 with stacked IC's, which provides a PSiP that is narrow, the PSiP 300 that includes side by side IC's provides a PSiP that is thin.

iii. Combination of Stacked and Side by Side IC's

Figure 4:
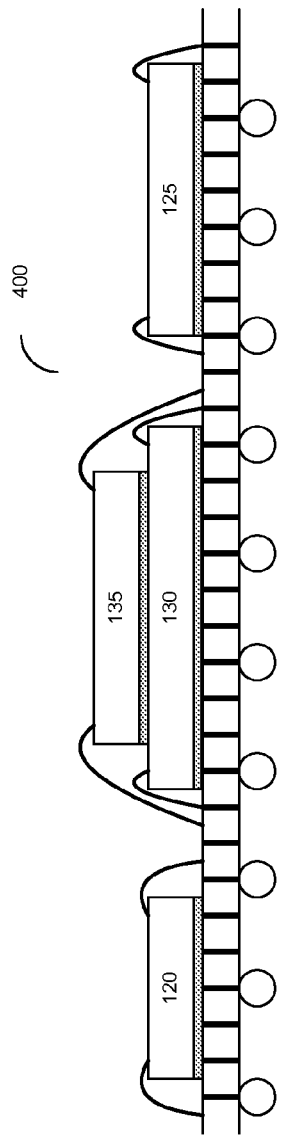
FIG. 4 illustrates a PSiP with IC's that are stacked and placed side by side.

FIG. 4 illustrates an example of a PSiP 400 that includes a combination of stacked and side by side IC's. In such an embodiment, some IC's of the PSiP 400 are stacked on top of each other, while other IC's of the PSiP 400 are placed side by side to each other. As shown in this figure, a first, second and third IC 120-130 is placed on top of a substrate 105. A first, second and third adhesive 140-150 respectively bond the first, second and third IC 120-130 to the substrate 105. A fourth IC 135 is placed on top of the third IC 130. A fourth adhesive 155 bonds the fourth IC 135 to the third IC 130. In some embodiments, at least one of the IC's 120-135 is a configurable IC. Furthermore, the PSiP 400 includes a first, second, third and fourth set of wire-bonding 160-175 that are attached respectively to the first, second, third and fourth IC's 120-135. As previously described, these sets of wire-bonding 160-175 allow the IC's 120-135 to communicate with each other. In other embodiments, the PSiP 400 further includes a BGA 110 and a set of vias 115 to allow the IC's 120-135 to communicate with IC's outside of the PSiP 400.

II. PSiP with Reconfigurable IC's

Figure 5:
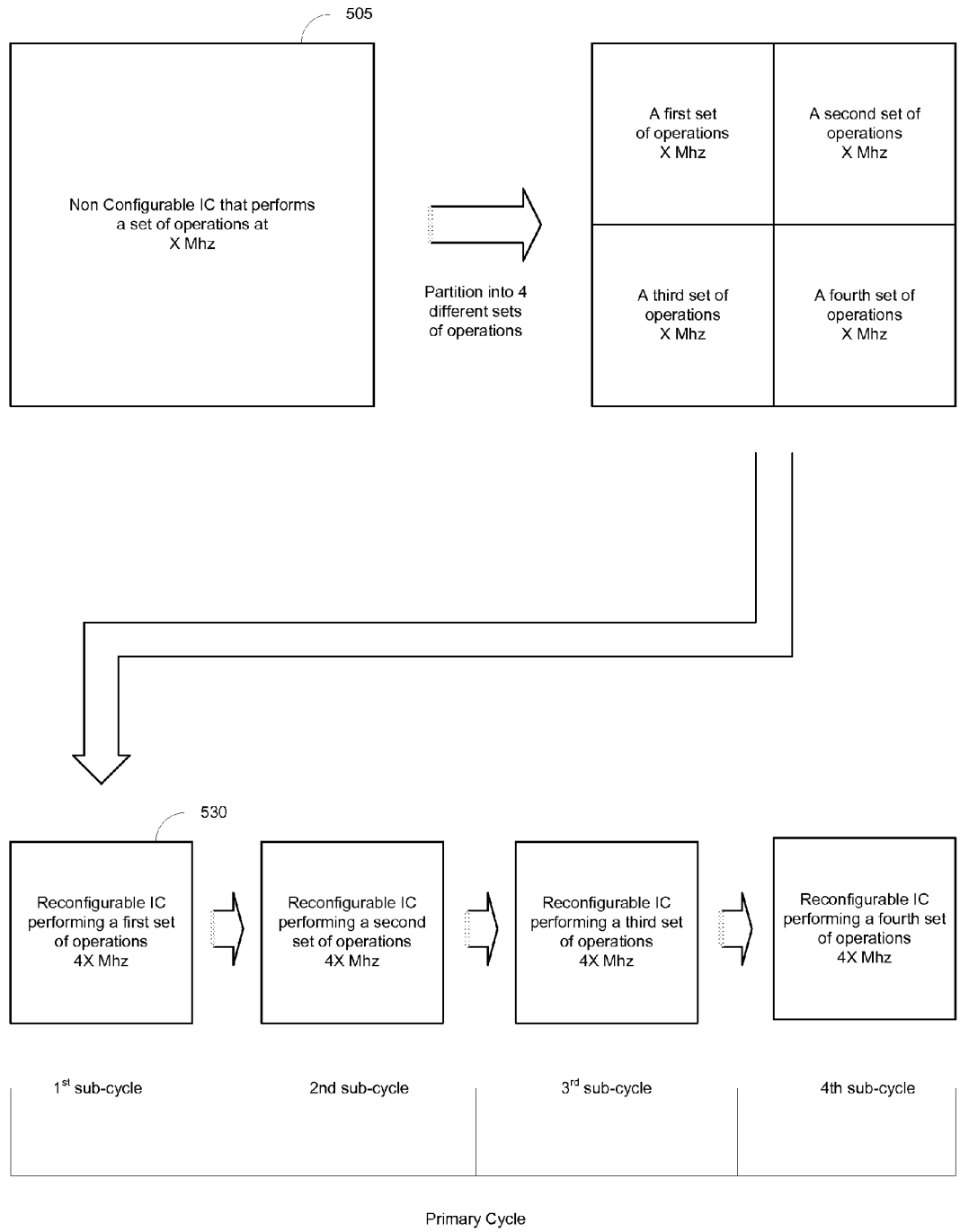
FIG. 5 illustrates a reconfigurable IC that can perform the operations of a non configurable IC.

In some embodiments, the configurable IC of the PSiP's described above is a reconfigurable IC that reconfigures more than once during runtime. In some embodiments, this reconfigurable IC might be a sub-cycle reconfigurable IC. FIG. 5 conceptually illustrates an example of a sub-cycle reconfigurable IC. Specifically, in its top left hand corner, this figure illustrates a non-configurable IC 505 that operates at a clock speed of X MHz. As further illustrated in this figure, the operations performed by this non-configurable IC 505 can be partitioned into four sets of operations that are each performed at a clock speed of X MHz.

FIG. 5 then illustrates that these four sets of operations can be performed by one sub-cycle reconfigurable IC 530 that operates at 4X MHz. In some embodiments, four cycles of the 4X MHz clock correspond to four sub-cycles within a cycle of the X MHz clock. Accordingly, this figure illustrates the reconfigurable IC 530 reconfiguring four times during four cycles of the 4X MHz clock (i.e., during four sub-cycles of the X MHz clock). During each of these reconfigurations (i.e., during each sub-cycle), the reconfigurable IC 530 performs one of the identified four sets of operations. In other words, the faster operational speed of the reconfigurable IC 530 allows this IC to reconfigure four times during each cycle of the X MHz clock, in order to perform the four sets of operations sequentially at a 4X MHz rate instead of performing the four sets of operations in parallel at an X MHz rate.

Figure 6:
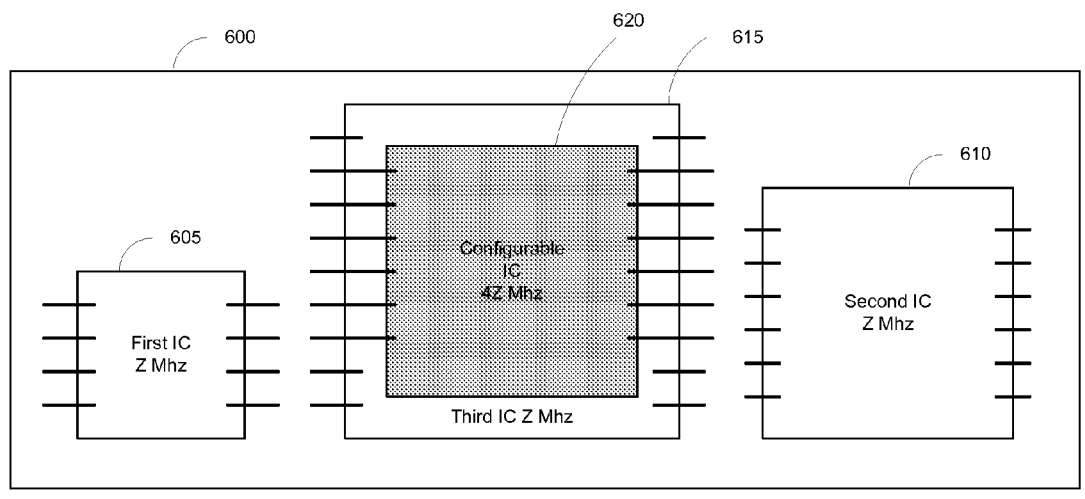
FIG. 6 illustrates a PSiP with a reconfigurable IC stacked on top of non configurable IC's.
Figure 6:
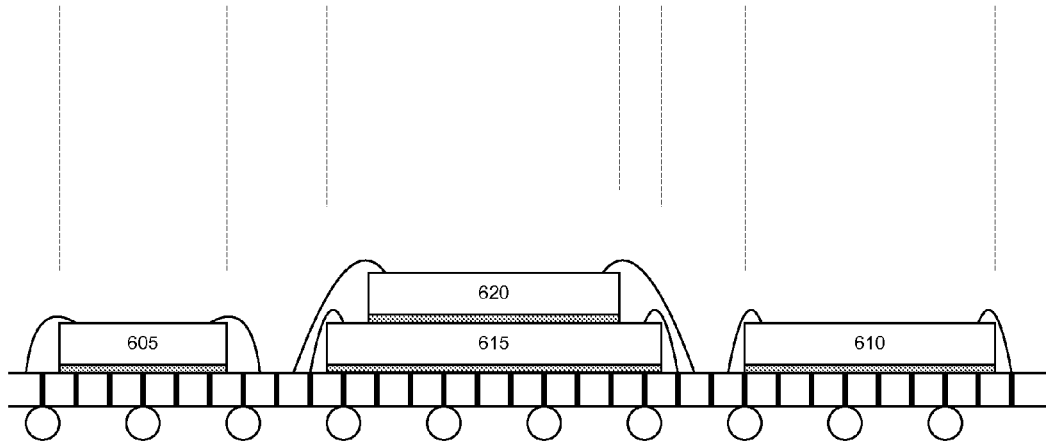

In some embodiments, a reconfigurable IC 530 reconfigures at a clock speed that is comparatively faster than the clock speed of some or all other IC's within a PSiP. FIG. 6 illustrates an example of such a PSiP. Specifically, this figure illustrates a PSiP 600 that includes a first, second, third and fourth IC 605-620. The first, second and third IC's 605-615 are non configurable IC's. As shown in this figure, each of the first, second and third IC's 605-615 operates at a clock speed of Z MHz or less. The fourth IC 620 is a reconfigurable IC which operates at a clock speed of 4Z MHz.

As shown in FIG. 6, the clock speed of the reconfigurable IC 620 is comparatively faster than the clock speed of the first, second and third IC's 605-615. In other embodiments, the clock speed of the reconfigurable IC 620 is comparatively faster than the clock speed of either the first, second or third IC 605-615.

III. Mixed Fabrication Technology

As mentioned above, the IC's within a PSiP can perform many operations. Examples of operations include a processor operation, an analog operation, a memory operation, etc. In some embodiments, these IC's are manufactured using different fabrication technologies. For instance, an IC that performs memory operations might be manufactured using 90 nm fabrication technology, while an IC that performs a processor operation might be manufactured using 130 nm fabrication technology, and an IC that performs analog operations might be manufactured using 180 nm.

Figure 7:
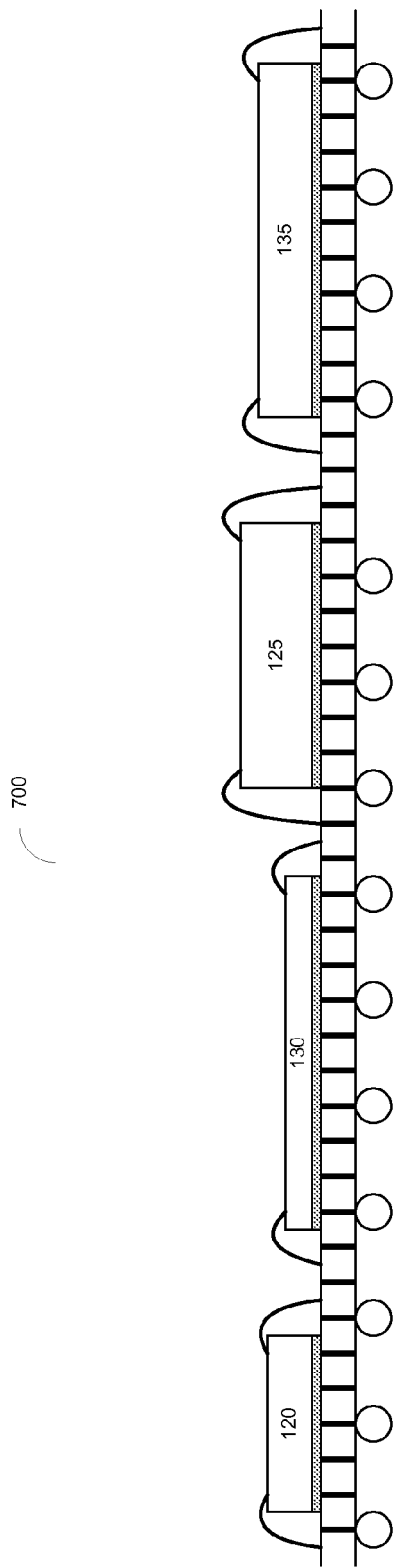
FIG. 7 illustrates a PSiP with IC's that have different manufacturing processes.

FIG. 7 conceptually illustrates a PSiP 700 that includes IC's with different fabrication technologies. The PSiP 700 includes a first, second, third and fourth IC 120-135 that are placed on top of the substrate 105. At least one of the IC's 120-135 is a configurable IC. In this figure, the IC's 120-135 have different dimensions (e.g., width, height) to illustrate pictorially and conceptually that some of the IC's 120-135 are manufactured with different fabrication technologies. Irrespective of the conceptual illustration in FIG. 7, one of ordinary skill will realize that using different manufacturing fabrication technologies might not result in IC's with different dimensions.

IV. PSiP with Heat Sink

Figure 8:
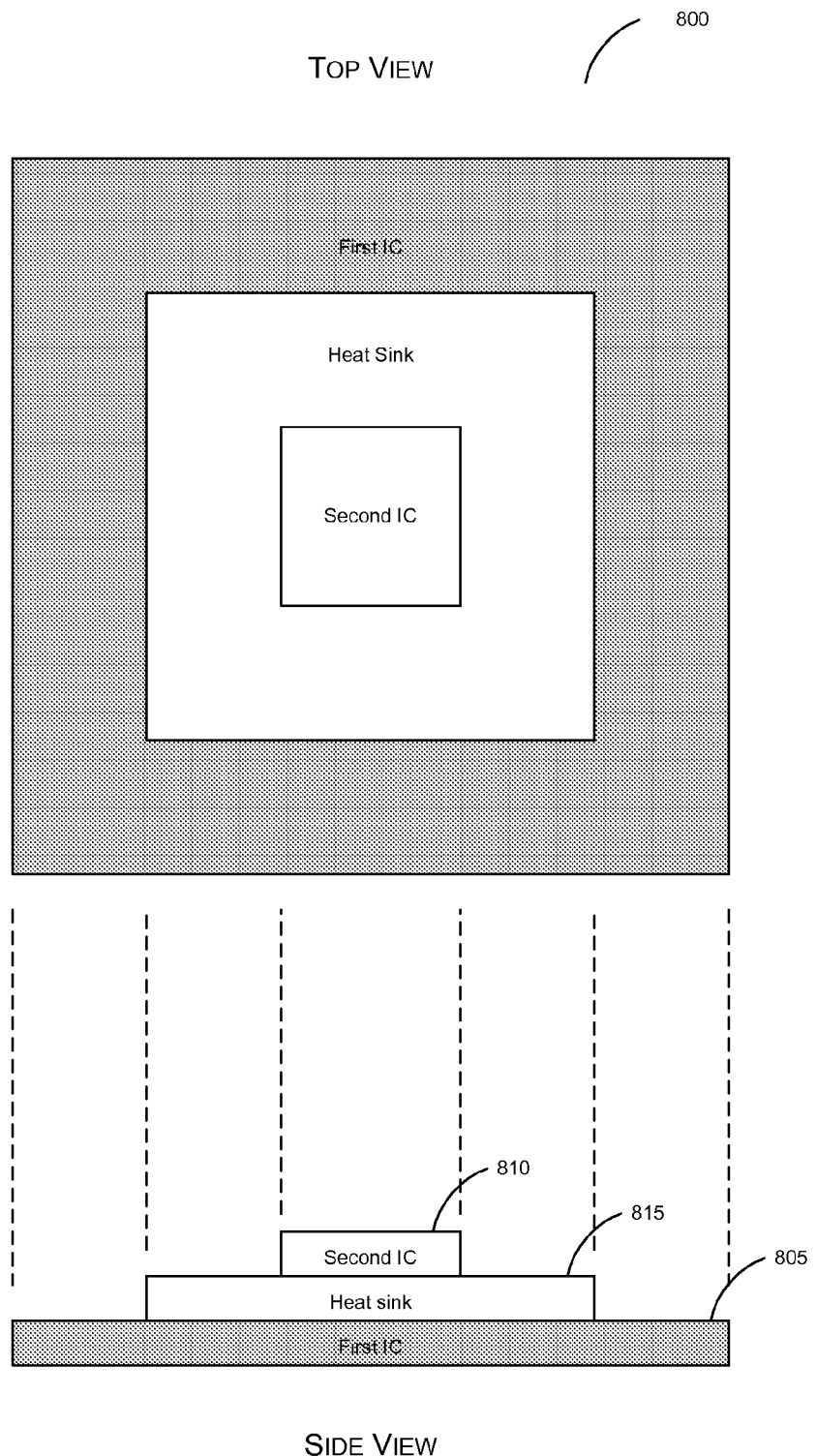
FIG. 8 illustrates a PSiP with a heat sink in the PSiP.

In some embodiments, a PSiP includes a heat sink. FIG. 8 illustrates an example of such a PSiP. As shown in this figure, the PSiP 800 includes a first IC 805 and a configurable IC 810. The configurable IC 810 is a reconfigurable IC in some embodiments. As shown in FIG. 8, the PSiP 800 also includes a heat sink 815 between the first IC 805 and the configurable IC 810. The heat sink 815 helps dissipate heat from the configurable IC 810 in the PSiP 800.

Figure 9:
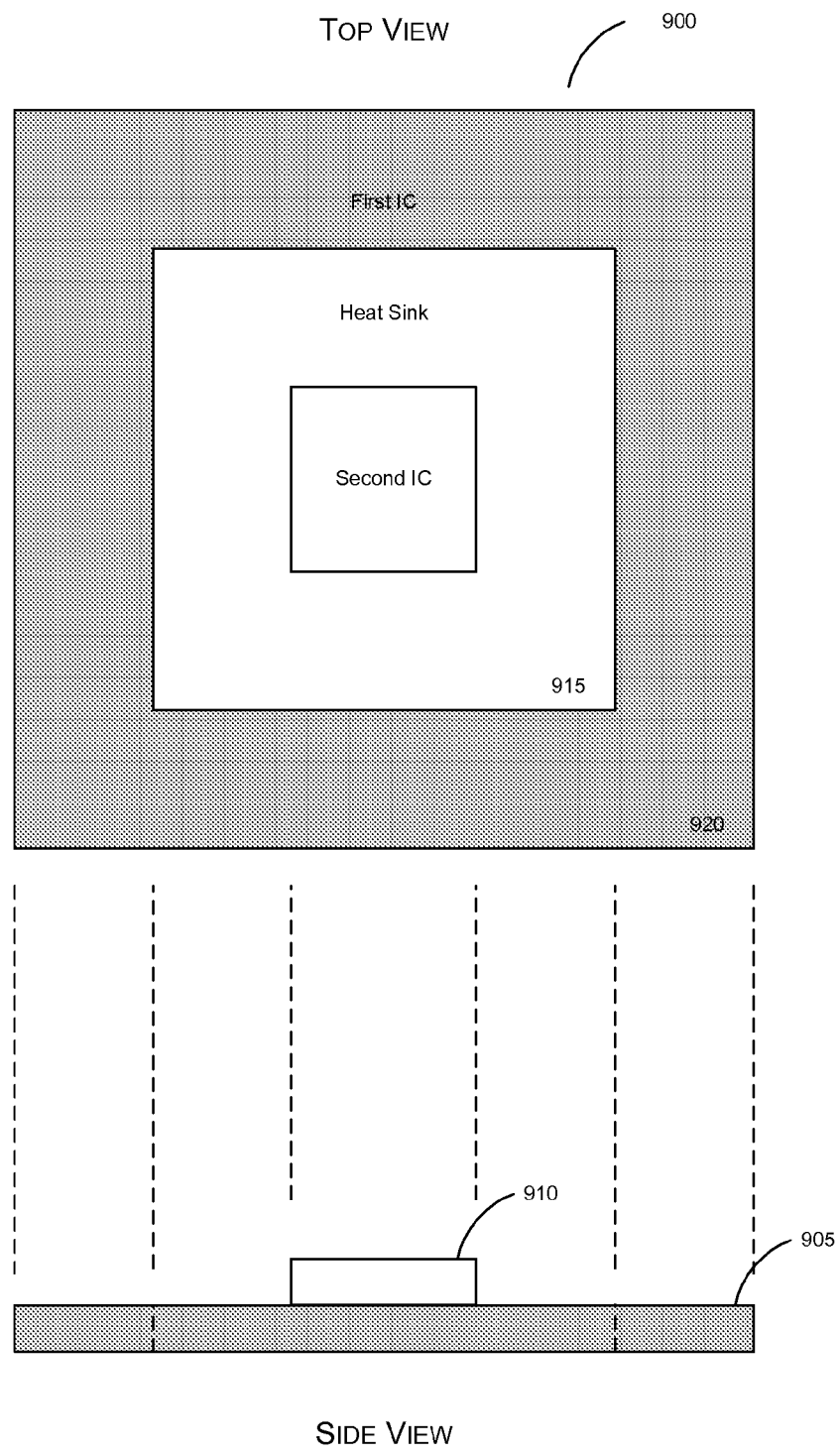
FIG. 9 illustrates a PSiP with a heat sink embedded in the first IC of the PSiP.

FIG. 9 illustrates another embodiment of a PSiP that includes a heat sink. As shown in this figure, the PSiP 900 includes a first IC 905 and a configurable IC 910. The configurable IC 910 is a reconfigurable IC in some embodiments. As shown in FIG. 9, the first IC 905 includes (1) a center area 915 on which no circuits are defined, and (2) a periphery area 920 on which circuit elements (e.g., transistors, resistors, wires, etc.) are defined. The center area 915 serves as a heat sink on which configurable IC 910 is positioned. In other words, the center area 915 helps dissipate heat from the configurable IC 910 in the PSiP 900.

Having described various PSiP that include a configurable or reconfigurable IC, a method of manufacturing a PSiP and selecting the IC's for the PSiP will now be described in detail.

V. Manufacturing PSiP

Figure 10:
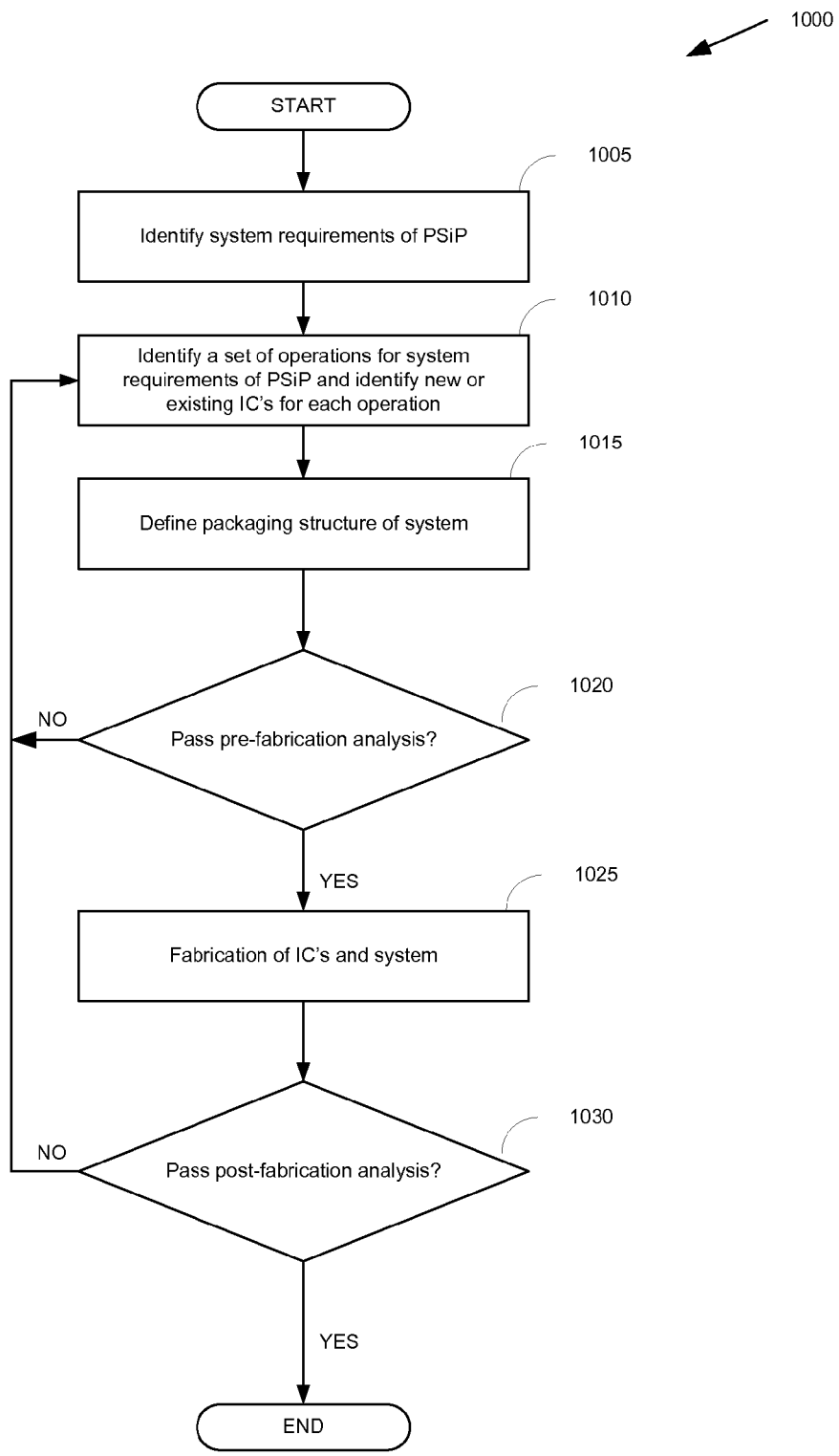
FIG. 10 illustrates a process of manufacturing a PSiP.

FIG. 10 conceptually illustrates a process 1000 for manufacturing a PSiP. As shown in this figure, the system requirements of the PSiP are initially identified (at 1005). That is, this operation identifies what performance objectives the PSiP has to achieve. After identifying (at 1005) the system requirements of the PSiP, sets of operations that are necessary for achieving the identified system requirements are identified at 1010. For each set of operation identified at 1010, a determination is made (at 1010) whether to implement the set of operations by using an existing IC or a new IC that will be specifically designed or configured to implement the set of operations. In some embodiments, at least one of the IC's identified at 1010 is a configurable IC. In some of these embodiments, this configurable IC is a reconfigurable IC that reconfigures more than once during run time. The operation at 1010 will be further described below by reference to FIG. 11.

After identifying new or existing IC's, a PSiP structure is identified (at 1015) for housing all the identified IC's. As described above, a PSiP can be structured in numerous ways. In some embodiments, a PSiP can include IC's that are stacked. In other embodiments, a PSiP can include IC's that are placed side by side. In yet other embodiments, a PSiP can include IC's that are placed side by side and stacked.

After defining (at 1015) the structure of the PSiP, a pre-fabrication analysis is performed (at 1020) to determine whether the designed PSiP is likely to satisfy the system requirements. If the designed PSiP fails this analysis, the process (1) returns back to 1010 to redefine the sets of operations and/or to modify the IC selection/design choices, and then (2) transitions to 1015 to define a PSiP structure for housing the IC's identified at 1010.

When the PSiP design passes the pre-fabrication analysis at 1020, the PSiP is manufactured (at 1025) based on the IC's identified in the last iteration of 1010 and the PSiP structure identified in the last iteration of 1015. In some embodiments, the manufacturing process entails purchasing and/or configuring only existing IC's to produce the desired PSiP. In other embodiments, the manufacturing process entails manufacturing at least one new IC to produce the PSiP.

After manufacturing the PSiP, the manufactured PSiP is tested (at 1030) to determine whether the manufactured PSiP meets the system requirements that were identified (at 1005). If not, the process returns to 1010, which was described above. When the manufactured PSiP passes the post-fabrication analysis at 1030, then the process 1000 ends.

VI. Identifying Reconfigurable IC's for PSiP

Figure 11:
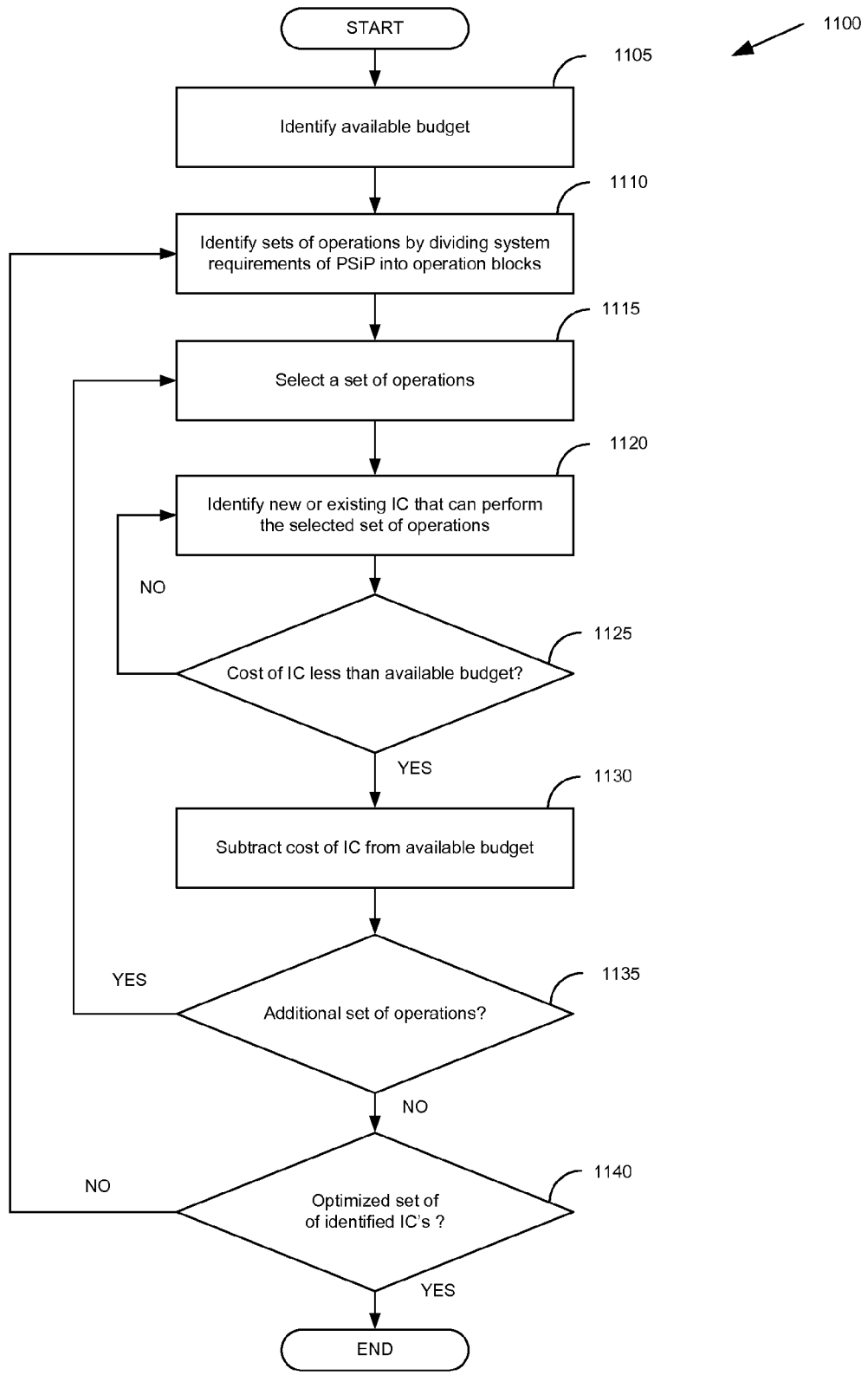
FIG. 11 illustrates a method of identifying IC's for a PSiP.

FIG. 11 conceptually illustrates a process 1100 for selecting and identifying IC's to be used in a PSiP. Some embodiments perform the process 1100 to implement the design operation 1010 in FIG. 10. As shown FIG. 11, an available budget for producing the PSiP is initially identified at 1105. In some embodiments, this budget is predicted on producing a certain number of PSiP's. Also, in some embodiments, the identified budget accounts for all funds necessary (1) for designing, configuring and manufacturing new IC or IC's if such IC's are required by the PSiP, and (2) for acquiring and/or configuring an existing IC. In other embodiments, this amount also includes the cost of the PSiP packaging, assembling, and/or testing.

Figure 12:
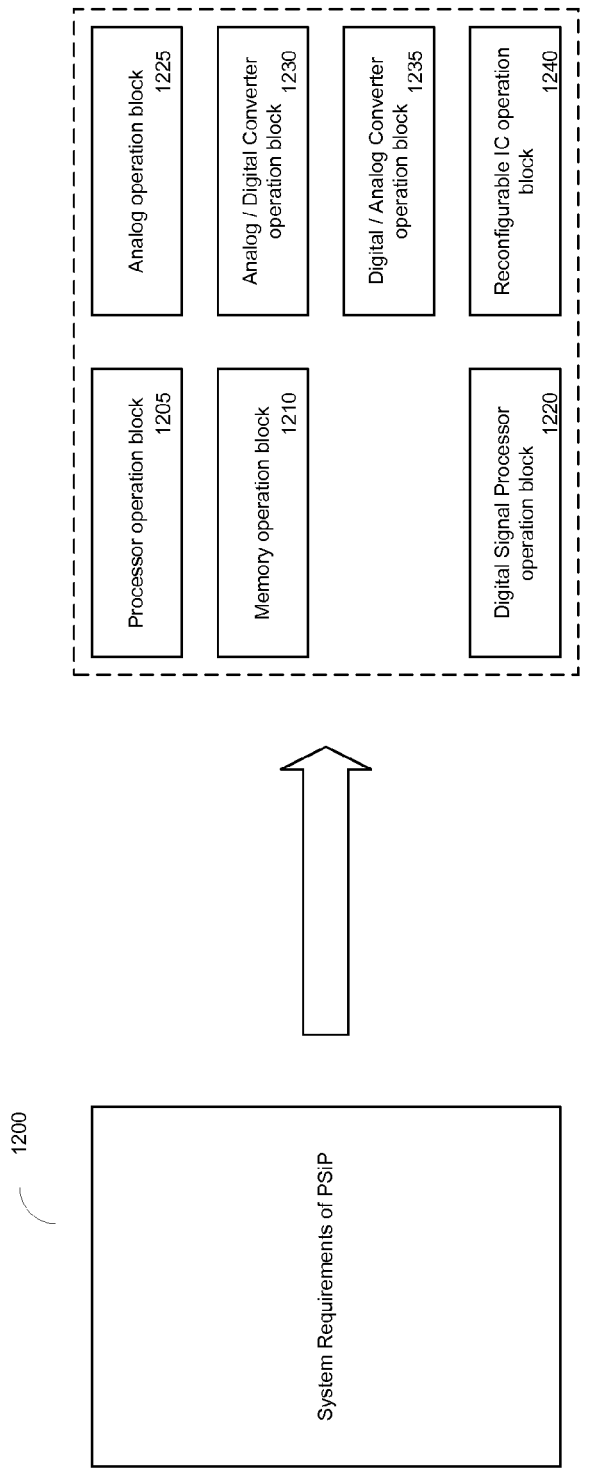
FIG. 12 illustrates an example of a system for a PSiP divided into a set of operations.

Once the available budget has been defined (at 1105), sets of operations are identified (at 1110) by dividing the system requirements of the PSiP into several operational blocks, where each operational block represents a set of operations that the PSiP has to perform. FIG. 12 conceptually illustrates an example of dividing the system requirements for a PSiP into several operational blocks. In this example, the operational blocks include a processor operation block 1205, a memory operation block 1210, a digital signal processor operation block 1220, an analog operation block 1225, an analog/digital converter operation block 1230, a digital/analog converter operation block 1235, and a reconfigurable IC operation block 1240. As mentioned above, each operational block includes a set of operations that the PSiP has to perform. For instance, the processor operation block 1205 may include a set of processing operations that the PSiP has to perform.

Once the sets of operations have been identified (at 1110) by dividing the system requirement of the PSiP into several operational blocks, one or more sets of operations (i.e., selects at least one or more operational blocks) are selected at 1115. After selecting one or more sets of operations at 1115, an IC that can perform the selected set or sets of operations is identified at 1120. The identified IC might be an existing IC that can perform or can be configured to perform the set or sets of operations selected at 1115. Alternatively, the identified IC might be an IC that has to be designed to perform, or has to be designed to be configured to perform, the selected set of operations. In at least one iteration through 1120, the selected IC is a configurable IC. In some cases, the configurable IC is a reconfigurable IC that can reconfigured more than once at run time.

Different identified IC's perform the selected set or sets of operations differently. For instance, a non-configurable IC that is identified at 1120 might perform in parallel the operations in the set or sets of operations selected at 1115. Alternatively, the IC identified at 1120 might be a configurable IC that can be configured to perform in parallel the operations in the set or sets of operations selected at 1115. On the other hand, the IC identified at 1120 might be a reconfigurable IC that sequentially performs one or more sub-sets of the operations in the set(s) of operations selected at 1115 during different reconfiguration sub-cycles.

Once the IC is identified at 1120, a determination is made (at 1125) as to whether the actual or estimated cost of the identified IC is less than the available budget. When the selected IC is a previously designed IC, the cost of the IC is the cost associated with purchasing, manufacturing, and/or configuring the previously designed IC. When the selected IC is an IC that has yet to be designed, the cost of the IC is the cost associated with designing, testing, manufacturing, and/or configuring the IC. Furthermore, in some embodiments, the cost of the IC accounts for costs associated with packaging and assembling the IC within the PSiP. In such embodiments, the process 1100 might perform the package-defining operation 1015 of the process 1000 of FIG. 10, or might simply account for the probable cost of such a packaging.

If the cost of the identified IC is not less than the available budget, the process 1100 proceeds back to 1120 to identify another IC for the selected set of operations. However, if the cost of the identified IC is less than the available budget, the process 1100 subtracts (at 1130) the cost of the identified IC from the available budget.

Once the cost of the identified IC has been subtracted from the available budget, a determination is made (at 1135) whether there is an additional set of operations that has not yet been associated with an IC. If so, the process 1100 (1) returns back to 1115 to select other set or sets of operations that have not yet been selected, and then (2) proceeds to 1120 to identify another IC for the newly selected set or sets of operations.

When it is determined (at 1135) that there is no additional set of operations, a determination is made (at 1140) whether the identified set of IC's is a good enough set of IC's for implementing the PSiP. For instance, when the identified set of IC's includes a reconfigurable IC, a determination might be made (at 1140) that the reconfigurable IC can perform additional operations in order to reduce the overall cost of the PSiP. Such additional operations would be operations that were previously identified for another IC. When a determination is made (at 1140) that the set of IC's is a good enough set, the process 1100 ends.

A PSiP, i.e., a SiP with a configurable or reconfigurable IC, has many advantages. A PSiP provides a simple solution for combining the often desirable configurable functionality of a configurable or reconfigurable IC with the functionalities commonly provided by other IC's. PSiP's are easier to design than the currently proposed SoC solutions that combine configurable functionality of configurable IC's with other IC functionalities.

Also, the IC's of a PSiP can be manufactured by different fabrication technologies. Hence, optimal fabrication processes can be used to manufacture the IC's of the PSiP. This is to be contrasted with the prior SoC solutions that require the use of one fabrication process for all the operational blocks on the SoC, which results in some of the operational blocks being manufactured by fabrication processes that are far from their optimal fabrication technology.

While the invention has been described with reference to numerous specific details, one of ordinary skill in the art will recognize that the invention can be embodied in other specific forms without departing from the spirit of the invention. For instance, some embodiments might first identify all the IC's for the PSiP and then determine whether the cost of all the IC's is less than the available budget. Furthermore, in some instances, some embodiments might identify an IC based on IC's that were previously identified. Additionally, some embodiments determine whether a set of IC's is optimized based on cost. As such, in some instances, a set of IC's is not optimized if the cost of the set of IC's can be further minimized. Thus, one of ordinary skill in the art would understand that the invention is not to be limited by the foregoing illustrative details, but rather is to be defined by the appended claims.

What is claimed is:

1. A system in package ("SiP") comprising a plurality of integrated circuits ("ICs"), the SiP comprising:
   a first IC comprising a plurality of reconfigurable circuits, each reconfigurable circuit for reconfigurably performing different operations based on different configuration data while the first IC is operating;
   a second IC coupled to the first IC;
   a substrate on top of which the first and second ICs are mounted; and
   a cap for encapsulating the top side of the substrate to form a housing that houses the first and second ICs.

2. The SiP of claim 1, wherein the first IC implements an IC that is designed to operate at a first clock rate, wherein the first IC operates at a second clock rate that is faster than the first clock rate.

3. The SiP of claim 2, wherein the first clock rate is a rate of a first clock, wherein the first IC reconfigures multiple times within a clock cycle of the first clock.

4. The SiP of claim 1, wherein the first IC operates at a first clock rate that is faster than a second clock rate of the second IC.

5. The SiP of claim 4, wherein the first clock rate is a clock rate at which the first IC reconfigures to perform different sets of operations.

6. The SiP of claim 4, wherein the first IC is a sub-cycle reconfigurable IC.

7. The SiP of claim 4, wherein the first IC performs different sets of operations during different clock cycles.

8. The SiP of claim 7, wherein the different clock cycles are sub-cycles of another clock cycle.

9. The SiP of claim 1, wherein one of the first and second ICs is a digital IC while the other of the first and second ICs is an analog IC.

10. The SiP of claim 1, wherein the first IC is manufactured with a first fabrication process and the second IC is manufactured with a second fabrication process.

11. The SiP of claim 1, wherein the first IC is positioned side by side to the second IC on the substrate.

12. The SiP of claim 1, wherein the second IC is positioned on the substrate, wherein the first IC is stacked on top of the second IC.

13. The SiP of claim 1 further comprising:
   a first set of wire-bonding coupled to the first IC; and
   a second set of wire-bonding coupled to the second IC, wherein the first and second sets of wire-bonding allow the first IC to communicate with the second IC.

14. The SiP of claim 13, wherein the first and second sets of wire-bonding are coupled to the substrate.

15. The SiP of claim 1, wherein when the first IC is operating, the SiP continuously receives power.

16. A system in package ("SiP") comprising:
   a substrate;
   a first integrated circuit ("IC") on the substrate;
   a second IC, wherein one of the first and second ICs comprises a plurality of reconfigurable circuits, each reconfigurable circuit for reconfigurably performing different operations based on different configuration data while the first IC is operating;
   a heat sink positioned between the first and second ICs; and
   a cap coupled to the substrate to create a housing that encapsulates the first IC, the second IC, and the heat sink.

17. The SiP of claim 16, wherein the IC that comprises the plurality of reconfigurable circuits implements an IC that is designed to operate at a first clock rate, wherein the other of the first and second ICs operates at a second clock rate that is faster than the first clock rate.

18. The SiP of claim 17, wherein the first clock rate is a rate of a first clock, wherein the IC that comprises the plurality of reconfigurable circuits reconfigures multiple times within a clock cycle of the first clock.

19. The SiP of claim 18, wherein the other of the first and second ICs operates at said first clock rate.

20. The SiP of claim 18 further comprising a set of one or more additional ICs housed in said cap, wherein each IC of said set of additional ICs operates at said first clock rate.

21. The SiP of claim 3, wherein the second IC operates at said first clock rate.

22. The SiP of claim 3 further comprising a set of one or more additional ICs housed in said cap, wherein each IC of said set of additional ICs operates at said first clock rate.

* * * * *